US009349936B2

(12) United States Patent
Otto

(10) Patent No.: US 9,349,936 B2
(45) Date of Patent: May 24, 2016

(54) REINFORCED HIGH TEMPERATURE SUPERCONDUCTING SILVER WIRE

(71) Applicant: Alexander Otto, N. Chelmsford, MA (US)

(72) Inventor: Alexander Otto, N. Chelmsford, MA (US)

(*) Notice: Subject to any disclaimer, the term of this patent is extended or adjusted under 35 U.S.C. 154(b) by 46 days.

(21) Appl. No.: 14/309,083

(22) Filed: Jun. 19, 2014

(65) Prior Publication Data

US 2014/0378314 A1 Dec. 25, 2014

Related U.S. Application Data

(60) Provisional application No. 61/836,912, filed on Jun. 19, 2013.

(51) Int. Cl.
H01L 39/00 (2006.01)
H01L 39/24 (2006.01)
H01L 39/12 (2006.01)

(52) U.S. Cl.
CPC .......... *H01L 39/248* (2013.01); *H01L 39/126* (2013.01)

(58) Field of Classification Search
CPC .................................. H01L 39/126–39/248
See application file for complete search history.

(56) References Cited

U.S. PATENT DOCUMENTS

| 5,252,543 A * | 10/1993 | Tanaka | H01L 39/143 257/E39.018 |
| 2004/0028886 A1* | 2/2004 | Inoue | H01L 39/14 428/293.1 |
| 2005/0059554 A1* | 3/2005 | Long | H01L 39/248 505/100 |
| 2009/0275479 A1* | 11/2009 | Shimoyama | C01G 29/006 505/230 |
| 2010/0062945 A1* | 3/2010 | Inoue | H01L 39/2409 505/231 |
| 2014/0349854 A1* | 11/2014 | Miura | H01B 12/02 505/100 |

* cited by examiner

Primary Examiner — Colleen Dunn

(57) ABSTRACT

Reinforced high temperature superconducting silver wire and materials, and methods of producing reinforced high temperature superconducting silver composite wire. More specifically reinforcement materials and assemblies for attaining much higher stress, bend and surface indent tolerances at practical conductor dimensions are described. The reinforced wire or methods can include a silver wire core and a layer of high strength reinforcing metal.

22 Claims, 4 Drawing Sheets

REINFORCED HIGH TEMPERATURE SUPERCONDUCTING SILVER WIRE

CROSS-REFERENCE TO RELATED APPLICATIONS

This application claims priority under 35 U.S.C. §119(e) to U.S. Provisional Patent Application Ser. No. 61/836,912, filed on Jun. 19, 2013, which is hereby incorporated by reference in its entirety.

FIELD

This application relates generally to reinforced materials for high temperature superconducting (HTS) round and low aspect cross-sectioned wires, and the wire architecture containing these materials such that the reinforced conductors can be used to produce superior high field magnet coils and compact high current cables. More specifically it relates to reinforcement materials for adequately improving axial tensile stress, bend and surface indent tolerance by adding reinforcement after the final superconducting oxide is formed inside the oxide-silver composite wire, expanding application of these HTS wires in devices that generate large magnet fields, and compact cables that operate at very high current densities.

BACKGROUND

Superconducting materials, in suitably developed forms, and at cryogenic temperatures, can transport without overheating, many times (in excess of 10 fold, and up to 100,000 fold) the electrical current that can be practically and economically transported by resistive materials such as copper, aluminum and silver of the same cross sectional area. For the purpose of clarity in this document, electrical conductors with cross-sectional shape aspect of less than about 3 are referred to as wires, while conductors with cross-sectional shape aspect greater than about 3 are referred to as tapes, and bundles comprised of two or more conductors are referred to as cables.

All three types can be used to produce coils that can generate very large magnetic fields, in stationary magnet applications like MRI, NMR and accelerator magnets, as well as in moving magnet applications such as in for example wind generators. However round wires and other conductors with low aspect cross sectional shapes, provide for superior, much less complex, more versatile cabling and coiling; simplified ease of use and lower cost. To date, however, and in spite of considerable effort, no high current density HTS oxide based superconductor has been commercialized in round wire or low aspect form due to difficulties in producing the well developed 2223/silver (also known as $Bi_2Sr_2Ca_2Cu_3O_x$/Ag where $Bi_2Sr_2Ca_2Cu_3O_x$ is 2223 and Ag is silver) based superconductor and the 2G YBCO 123 based superconductors in any form other than as thin tapes with shape aspect ratios in excess of 10, and difficulties in developing scalable, high current density forms of 2212/silver (also known as $Bi_2Sr_2Ca_1Cu_2O_x$/Ag where $Bi_2Sr_2Ca_1Cu_2O_x$ is 2212 and Ag is silver) wires and processes for their manufacture.

Recently however, considerable, rapid progress has been made on the development of 2212/Ag round and rectangular wire with critical current densities exceeding 800 A/mm$^2$ at 4.2 K in a 5T field. These wires, coupled with embodiments of the present invention, enable the production of a practical, low aspect 2212 based wire with critical current density exceeding 500 A/mm$^2$ at 4.2K and in greater than 5T field and with tensile stress tolerance exceeding 400 MPa, tensile strain tolerance exceeding 0.3% and bend tolerance allowing bending below a diameter of about 275 times the wire cross section in the bend direction, and preferably 250 times the wire diameter.

HTS based superconductors can also be used to transmit very large amounts of electric power in very high current cables over large distances with very little energy loss. In the case of magnets, the interaction between the moving charge in the conductor and large magnetic field can result in very large axial forces (the Lorentz force F=IL×B where I is electrical current, L is conductor length and B is magnetic field impinging on the conductor, and × denotes cross product) in the conductor at high fields, requiring reinforced conductors with very high levels of axial stress tolerance without degradation in conductor properties, primarily its current carrying capacity.

Although superconducting materials can transport much greater current densities than resistive materials, beyond a certain critical current (Ic) and corresponding critical current density level (Jc), they exhibit rapidly increasing resistance, limiting their use to the regime below Ic and Jc. Addition of reinforcement and other materials increases conductor cross sectional area, and therefore reduces the maximum engineering current density (Je) that the conductor can be operated at before reaching the intrinsic Jc of the superconducting material. It is therefore of great value and importance to add as little material as possible to attain a desired level of reinforcement (and insulation).

The 2212/Ag round and low aspect rectangular wire forms currently under development are the best candidates for achieving low field-ramp loss, high-current cables and HTS coils beyond the cabling, loss and current density limits of commercially developed high aspect YBCO 2G and 2223/Ag tapes. However, round, and low aspect rectangular 2212/Ag composite wire is currently inadequate for use in demanding coil and cable designs because of poor stress, strain, bend and indent tolerance.

The 880 C bake for achieving high current anneals the oxide dispersion strengthened Ag matrix, which combined with the low modulus of silver impairs limits tensile stress tolerance to below 200 MPa, tensile strain tolerance to below 0.3% and bend tolerance to diameters that are greater than 250 times the wire cross-section in the bend direction. In fact, 2212/Ag use is now limited to "wind and react", where precursor wire/cable with ceramic insulation is wound into coils first, then baked at 880 C. This approach to coil and cable making severely limits the types of coils that can be produced, and it greatly increases the complexity and difficulty of making coils and cables.

These issues also challenged 2223/Ag high aspect tape product development in efforts to make them suitable for use in mechanically demanding applications. However, reinforcement techniques have been developed to solder laminate, in the state of the art, high strength stainless steel strips on each side of the tape, thereby increasing the tensile stress and bend tolerance of for example reinforced 2223/Ag tapes by more than two fold without impractically increasing reinforced tape cross sectional area compared to the core 2223/Ag cross sectional area. However no design or method has been advanced for improving the mechanical properties of round and low aspect 2212/Ag wires to the above described levels for enabling practical application of low cost, versatile react and wind approach to coil production with 2212/Ag based HTS conductors.

A significant part of the reason why round wire reinforcement has not occurred is that it has proven to be more difficult to reinforce the round and low aspect conductor shapes than the reinforcement of the thin, high aspect tapes. The low aspect conductors place more extreme demands on any approach to reinforce them adequately, in particular, uniformly, without adding so much material and thereby reducing conductor current density to obviate its utility, and without damaging the ceramic 2212 or 2223 superconducting material and thereby impairing its functionality.

Applications and aspects of embodiments provided herein address long-felt needs in the art. Stress, strain and bend tolerance herein is meant as retaining in excess of 95% of the original critical current level of the reinforced wire, after the independent application of any of the above described mechanical conditions anywhere along the wire's length. The mechanical condition where irreversible Ic degradation first exceeds 5% (and sometimes a low as 1% depending on the test equipment and method) is commonly measured by a transport 4 point test method.

In specific embodiments provided herein, voltage measuring electrical contacts are positioned on the reinforced superconductor inside of the region between electric current injecting contacts. Tensile stress and strain in the material is progressively increased while critical current is measured at each stress increment by sweeping current up to the onset of voltage. By this method the stress and strain resulting in the onset of irreversible Ic degradation in the superconducting material is determined at stress and strain conditions ranging from 300 K to 4 K, depending on the capabilities of the equipment.

SUMMARY

Specific embodiments provided herein describe a reinforced high temperature silver/superconducting oxide composite wire core of substantially round cross section having a length and an exterior surface; one or more split cylinder shaped layers of high strength reinforcing metal circumferentially surrounding a substantial portion of the exterior surface of the silver wire core at a point along the length of the composite wire; and a bonding material between the silver wire core and the reinforcing metal; and the reinforcing metal and the bonding material at any point along the length of the composite wire occupy less than about 50 percent of the total composite wire cross sectional area and the tensile stress tolerance of the composite wire exceeds about 400 Mega Pascal (MPa), and tensile strain tolerance exceeds 0.30 percent when the composite wire is below a temperature of about 300 Kelvin.

Additional specific embodiments describe a reinforced high temperature superconducting silver composite wire comprising: a silver wire core of substantially rectangular cross section having a length and an exterior surface; two or more strips of high strength reinforcing metal that are each substantially U-shaped, together surrounding the entire exterior surface of the silver wire core along the length of the composite wire, the two or more strips arranged on directly opposing sides of the silver wire core, overlapping each other for substantially the entire length of two sides of the silver wire core; and a bonding material between the silver wire core and the reinforcing metal; and the reinforcing metal and the bonding material at any point along the length of the composite wire occupy less than about 50 percent of the total composite wire cross sectional area and the tensile stress tolerance of the composite wire exceeds about 400 MPa, and tensile strain tolerance exceeds 0.30 percent when the composite wire is below a temperature of about 300 Kelvin.

Specific embodiments herein provide for a method of producing reinforced high temperature superconducting silver composite wire comprising: providing: a silver wire core of substantially round cross section having a length and an exterior surface; a split cylinder shaped layer of high strength reinforcing metal; and feeding the silver wire core and the reinforcing metal from their respective payoffs towards each other while applying back tension to the silver wire core and the reinforcing metal, such that the back tension applied to the silver wire core is much less than the back tension applied to the reinforcing wire; feeding the silver wire core and the reinforcing metal into an assembly tool; pushing the silver wire core into the reinforcing metal with grooved rolls; applying flux, solder, heat, and providing a converging force to the silver wire core and the reinforcing metal; and chilling the silver wire core and the reinforcing metal; producing the reinforced high temperature superconducting silver composite wire wherein the reinforcing metal and the bonding material at any point along the length of the composite wire occupy less than about 50 percent of the total composite wire cross sectional area and the tensile stress tolerance of the composite wire exceeds about 400 MPa, and tensile strain tolerance exceeds 0.30 percent when the composite wire is below a temperature of about 300 Kelvin

DETAILED DESCRIPTION

Figure 1A:
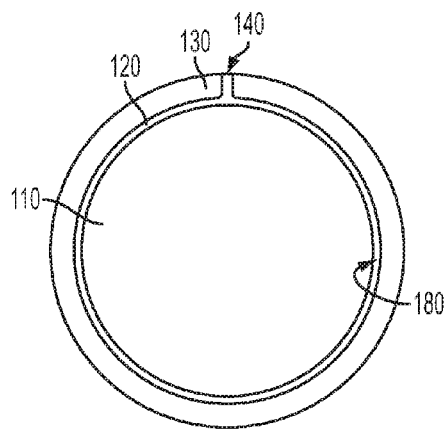
FIG. 1 illustrates a round wire reinforced article.

Specific embodiments of the present disclosure will now be described. The invention may, however, be embodied in different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which embodiments of this invention belong. The terminology used herein is for describing particular embodiments only and is not intended to be limiting of the invention. As used in the specification and appended claims, the singular forms "a," "an," and "the" are intended to include the plural forms as well, unless the context clearly indicates otherwise.

Unless otherwise indicated, all numbers expressing quantities of ingredients, properties such as molecular weight, reaction conditions, and so forth as used in the specification and claims are to be understood as being modified in all instances by the term "about," which is intended to mean up to ±10% of an indicated value. Additionally, the disclosure of any ranges in the specification and claims are to be understood as including the range itself and also anything subsumed therein, as well as endpoints. Unless otherwise indicated, the numerical properties set forth in the specification and claims are approximations that may vary depending on the desired properties sought to be obtained in embodiments of the present invention. Notwithstanding that numerical ranges and parameters setting forth the broad scope of embodiments of the invention are approximations, the numerical values set forth in the specific examples are reported as precisely as possible. Any numerical values, however, inherently contain certain errors necessarily resulting from error found in their respective measurements.

Parts of methods described herein such as mathematical determinations, calculations, inputting of data for computations or determinations of equations or parts thereof can be performed on parts of or one or more computers or computer systems that can include one or more processors, as well as software to run or execute programs and run calculations or computations.

Aspects of methods provided herein can include at each step an assessment of the material or materials being used for the wire or wires, and if a determined or pre-determined level of a property is not met, then the material can be rejected and/or discarded; while if the level is met, the material can proceed to additional steps of the process and/or can be accepted and/or used if a stage has been reached where a product or other version of the wire has been reached. In specific embodiments, physical and/or other aspects of the material or materials such as components of the silver wire, or silver wire, or materials associated with the silver wire, are assessed to make a determination of acceptance or rejection; in specific embodiments assessment is performed for one or more steps of FIG. 3. The assessment can include any aspect provided herein such that a level or range can be used in the determination; non-limiting examples include one or more of dimensions, tolerances, stresses, or strains, among others.

As used herein, the term "wire" refers generally to a high temperature superconducting composite with a width that is less than 3 times its thickness.

As used herein, the term "strip" refers generally to the reinforcement material in a form that renders it suitable for attachment to the superconducting wire or tape, generally with a width that is at least 10 times greater than its thickness, and that has been produced so as to shape it and make it adherent to the superconducting tape.

As used herein, the term "substantial portion" refers generally to greater than or equal to approximately half: for example in specific embodiments one or more split cylinder shaped layers of high strength reinforcing metal circumferentially surrounding a substantial portion of the exterior surface of the silver wire core. As used in the previous sentence, a "substantial portion" refers to coverage of approximately half or more of the exterior surface of the silver wire core (which as described herein can be at a single point or more than a single point along the length of the silver wire core).

In the case of round wire reinforcement, the term "split cylinder shape" refers to the reinforcement strip shaped into an approximately cylinder cross sectioned shape, but with its two edges separated from each other, and not forming a continuous fully enclosed cylinder shape.

As used herein, the term "core" refers generally to the high temperature superconducting oxide composite wire that is placed inside and attached to the enclosed space formed by the reinforcement strip or strips.

The designs, materials and methods described herein provide 2212-based round and other low aspect cross section based shaped HTS wire forms, with greatly improved mechanical properties, axial tensile stress tolerance exceeding 400 MPa, axial tensile strain tolerance exceeding 0.30%, bend tolerance to diameters that are below 275 times the wire cross section dimension in the bend direction, and greatly improved indent tolerance, with less than 50% of the reinforced wire being comprised of reinforcement related materials added to the HTS core wire. These properties are required for example to make coils that can reliably generate high magnetic fields, in excess of 17 T and preferably in excess of 27 T, without failure, as well as much lighter, higher-efficiency, higher-power wind generators. The 2212/Ag wire is the best candidate for achieving low field-ramp loss, high-current HTS coils beyond the cabling, loss and current density limits of state of the art high aspect YBCO 2G and 2223/Ag tapes.

Embodiments of the present invention identify a design, method and specific combination of attributes in reinforcement materials and specific fabrication conditions applied after the 2212/Ag wire is fully processed into its high current density form, to produce reinforced 2212/Ag wire with significantly improved axial tensile stress tolerance, utility and lower cost, as compared to the best state of the art attained by using higher strength silver, or reinforcement that is added before the 2212/Ag is fully processed.

Specific embodiments provided herein comprise an article consists of a 2212/Ag core wire that is round or some other low aspect shape, surrounded by a bonding material such as solder, and then one or more split cylinder shaped metal strips, enclosing in excess of 80% of the 2212/Ag wire perimeter in the round wire case, and a conformed shapes, like U-shaped channels, in the case of other geometries like rectangular wires. Specific embodiments include silver core wire.

More specific embodiments provided herein describe a reinforcement material and bonding material surrounding 2212/Ag wire with the following combinations of high CTE, modulus of elasticity and yield strain: Average CTE that exceeds $11 \times 10^{-6}$ m/m/K from attachment above 400 K to below 110 K; elastic modulus that exceeds 185 GPa at about 25 K and exceeds 200 GPa at below 110K; proportionality limit strain that exceeds 0.25% at attachment temperature down to 4.2 K.

In a more preferred embodiment, the reinforcement material average CTE exceeds $11 \times 10^{-6}$ m/m/K from attachment above 400 K to below 110 K; its elastic modulus exceeds 205 GPa at about 25 K and 220 GPa at below 110K; proportionality limit strain exceeds 0.45% at attachment temperature down to 4.2 K.

Yet more specific embodiments provided herein describe a reinforcement with a figure of merit value FOM>850% GPa/K, where FOM=CTE×Proportionality Limit Strain×Modulus. Where CTE is in PPM m/m/K, Elastic Modulus is in GPa and Proportionality Limit is in percent (Note: proportionality strain limit can be practically estimated from high quality stress-strain data by applying a tighter, 0.01% to 0.1% offset strain criterion than the commonly used 0.2% level). In a preferred embodiment the FOM of the reinforcement material exceeds 1050% GPa/K.

Articles such as coils and cables constructed from a reinforced 2212/Ag wire with the above properties and design are contemplated as part of specific embodiments of this invention, as they have not been previously produced by the much simpler, lower cost and much more broadly useful wind and react method, that is enabled by embodiments described herein. In particular, coils and cables that are made with reinforced 2212/Ag low aspect shaped wires containing a bonding material and reinforcement as described herein, and that exhibit the mechanical properties described herein, and that are constructed by a react and wind approach in which no further processing of the cable or coil is required after its construction to change the form of the 2212 superconductor to improve its critical current, are herein contemplated.

Architecture and Design

Figure 1B:
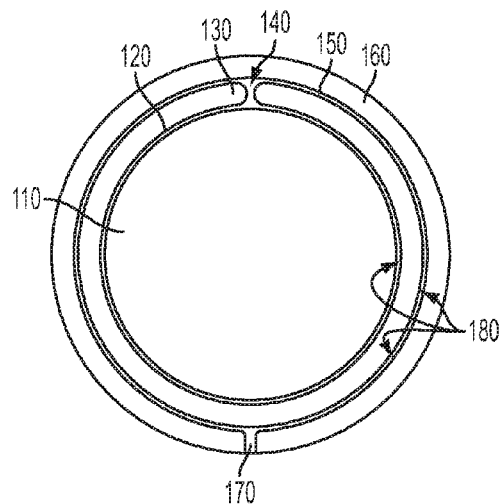

The reinforced wire design consists of a 2212/Ag wire core 110 and 210 shown in FIG. 1 and FIG. 2, that has a substantially round or low aspect cross-sectioned shape like a square, hexagon, or rectangle of width less than 3 times its thickness, that is substantially surrounded by at least a bonding material 120, 150, 220 comprised of a solder with a melting temperature below 400 degrees Celsius or an organic adhesive, and a high yield strain, high modulus, high CTE reinforcement material 130, 160, 190, 230 and 250. In the case of solder bonding material, the outside of the reinforced conductor may also be advantageously covered with a thin layer of solder, that also bridges regions where the reinforcement material does not cover the 2212/Ag wire 140, 170, 195, 240. This provides for improved dimensional uniformity that enables production of coils with improved uniformity in wire spacing and placement, and as a consequence if this, improved uniformity in magnetic field homogeneity that is vital in applications like NMR and MRI. The regions between overlapped reinforcement materials are also filled with solder or adhesive material 150 and 260. FIG. 1 at 180 shows the surfaces of the reinforcement material that may be pretreated to provide them with improved wetting and adhesion by the solder or adhesive. This pretreatment may include cleaning and/or coating of these surfaces with very thin (for example less than 10 micrometers and more preferably less than 3 micrometers of copper, tin, or any other material that improves wetting).

It is important to cover over at least 80% of the surface of the 2212/Ag wire with reinforcement material, in order to provide the reinforced wire with tensile stress tolerance in excess of 400 MPa and tensile strain tolerance in excess of 0.3% everywhere along its length, and bend tolerance to a bend diameter less than 275 times the thickness of the reinforced wire in any axial wire bend direction, such that the total cross sectional area of the added materials to the 2212/Ag wire do not exceed 50%, and more preferably 35% of the cross sectional area of the reinforced wire. This provides the reinforced conductor with higher operating current density. The specific reinforcement material and its application method are also vital for attaining the above described mechanical properties.

In this approach, the reinforcement material is adhered to the bonding material and the bonding material is adhered to the surface of the 2212/Ag wire with sufficient bond strength so as to mitigate loss of adhesion and de-lamination during subsequent handling and use.

In one embodiment, the bonding material is a low melting solder containing at least 5% of any of the following: Sn, Pb, Sb, Ga, In or Cd.

In order to improve wetting and adhesion in the case of solder bonding, specific embodiments of the invention may include application of wetting materials to the surface of the reinforcement strips and 2212/Ag wire, typically to a thickness of less than 10 micrometers. The wetting enhancing material may be comprised of for example copper, silver, gold, any of the platinum group metals, as well as solder constituents, such as tin, lead, indium and the like. These materials may or may not be evident as layers in the reinforced wire as the attachment process can promote their reaction with and diffusion into the solder. The wetting material may be deposited onto the reinforcement strips before forming and attachment, by for example electroplating, hot dipping and the like.

Round Wire

In the case of substantially round wire, FIG. 1 at (A) shows the reinforcement 130 is a metal strip that has been formed into a split cylinder shape that encloses the silver wire core 110, with the two edges converging but not overlapping, and the residual gap being filled with solder or other like material, and the gap occupying no more than 20% of the perimeter around the enclosed article.

In a further embodiment (FIG. 1B), a second split cylinder strip is added as shown 160 such that its convergent edges are at least 20 degrees rotated from the convergent edges of the underlying strip 130 and the gap between these two edges, so that every part of the 2212/Ag wire is covered by at least one layer of reinforcement.

Figure 1C:
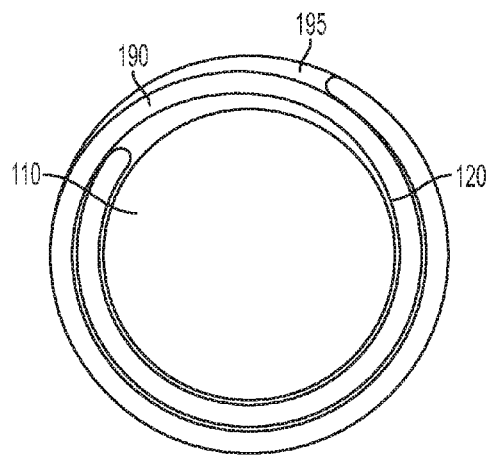

Additional cylinder shaped strips may be added in the manner described, such that no section of the reinforced wire has less than n−1 layers of strip over the 2212/Ag wire where n is the number of strips used. In another embodiment the strip width prior to forming it into the split cylinder shape, is greater than the perimeter circumference of the article to be enclosed, and upon forming and attachment onto the article, its overlaps onto itself such that up to 99% of the enclosed article has a double layer of reinforcement, and the cylinder shaped strip is comprised of a helix configuration in cross section (FIG. 1C). Several cylinder shaped strip layers are contemplated to be added, with non-limiting examples being 1, 2, 1-5, 1-10, or more layers to be used alone or in combination. Multiple layers of thinner reinforcement help avoid excessive near surface straining, cracking and damage of the reinforcement when forming the split cylinder shape.

FIG. 1C. Rectangular 2212/Ag Wire

Figure 2A:
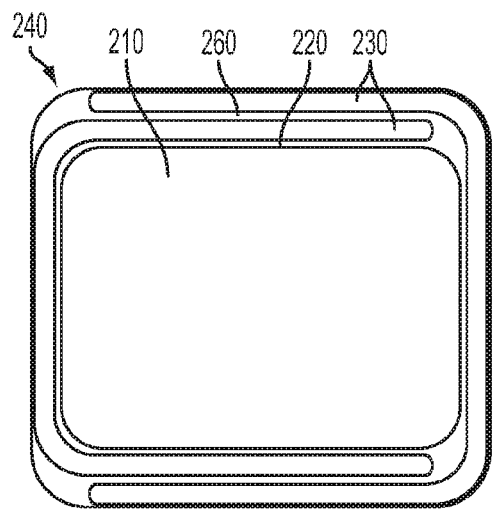
FIG. 2 illustrates embodiments (A, B) of a rectangular reinforced article.
Figure 2B:
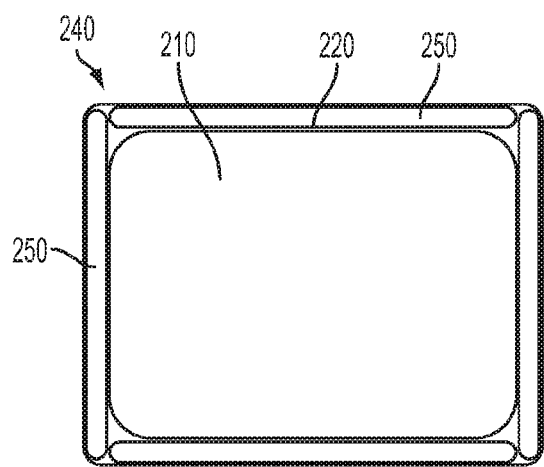

In the case of rectangular cross sectioned 2212/Ag wire, FIG. 2, 210, the solder bonding material 220 also surrounds and wets the 2212/Ag wire. In one embodiment, FIG. 2A, reinforcement strips with U-shaped cross sections 230 are used, with additional wetted solder between the two U shaped strips 260 where they overlap 230 for example on the wider top and bottom surfaces of the wire. In this design, the strips can also be applied so as to bring the cross sectional shape of the reinforced wire to a lower aspect shape, square in this case, improving the utility of the conductor in attaining higher density coil windings, and in making high density packed cables from the wire. It is recognized that additional layers may be added in kind. The U shaped reinforcement strip can be formed before the attachment step. With appropriately shaped tooling the solder surrounding the assembly can be imparted with a space filling and somewhat rounded corner configuration. This is advantageous because sharp edges can cut through insulation and are more easily damaged. It is particularly desirable for the corner radii on the cross section to exceed about 10% of the wire width dimension (e.g. its larger cross sectional dimension). In specific embodiments the reinforcement strip is approximately U shaped. The U shaped reinforcement strip may be advantageously formed while it is in an annealed, or pre precipitation hardened state where it can support large plastic strains needed to form the small radius bends at the corners. After forming the U shape reinforcement, the strip may be stretched axially between 1% and 15% to work harden it and increase its yield stress and strain, or in the case of other alloy types it may be precipitation hardened by heat treatment to increase its yield stress and strain.

In another embodiment for example with rectangular wire, 4 strips 240 are solder bonded 220 to each flat surface, FIG. 2. The widths of these strips can be varied so as to produce sharp cornered reinforced wires 240, or wires with rounded corners, again with the solder providing the round space filling contour there.

Reinforced Material Properties

The critical reinforcement material attributes are elastic modulus, proportionality limit strain in tensile deformation beyond which irreversible plastic strain occurs, and coefficient of thermal expansion (CTE), all of which it is recognized in specific embodiments of this invention, must exceed in combination, difficult to attain threshold levels.

The critical fabrication conditions are the high level of tensile load (resulting in tensile elastic strain) that must be applied to the reinforcement strip as it is bonded to the superconducting tape, and the highest practical temperature at which the attachment is completed.

The critical architectural feature, and the one that greatly improves the utility of reinforced superconductors, is the ratio of reinforcement to conductor cross-sectional area that is required to improve stress tolerance to a required level. Specific embodiments of the invention provides for much greater tensile stress tolerance at cross-sectional area ratios below 35% than what can and has been attained with state of the art stainless steel.

Method/Material Properties

The critical reinforcement material attributes are elastic modulus, proportionality limit in tensile deformation beyond which irreversible plastic strain occurs, and coefficient of thermal expansion (CTE), all of which must exceed in combination, difficult to attain threshold levels.

The critical fabrication conditions are the high level of tensile load and resulting highest possible tensile elastic strain that must be applied to the reinforcement strip as it is bonded to the superconducting tape, and the highest practical temperature at which the attachment is completed. The strained strips, upon attachment and release from back-tension on the payoff side, then contract axially and place the superconductor core into axially compressive strained state. The greater the axially compressive strain the larger the axial tensile strain that can be supported by the reinforced superconductor before its tensile stress tolerance limit is reached. A sufficiently high CTE enhances this effect upon cool down from the attachment temperature to the cryogenic operating temperature. A higher attachment temperature also enhances the effect by allowing for a greater temperature range over which the CTE can contract and place the superconductor into a greater axially compressive state.

It should be noted however that too large of a CTE, tension or modulus in the lamination strip can also place too much axial compressive strain into the superconductor right after attachment of the strip and before cool-down, and result in current density degradation. For this reason, a very high modulus material, low CTE material like Tungsten (400 GPa, 5 ppm m/m/k) will not provide the improvements described herein. Conversely, a very high CTE, low modulus material like Zn will not provide the improvements described herein.

The direct role of the elastic modulus in improving tensile stress tolerance is two-fold. First, upon attachment and release, the contraction strain of the reinforced tape to internal equilibrium is increased and secondly, the reinforced tape modulus is increased by a larger strip modulus as described in [6], so that a greater tensile load and stress is required to strain the tape to its tensile strain limit.

The critical architectural feature, and the one that greatly improves the utility of reinforced superconductors, is the ratio of reinforcement cross-sectional area to conductor cross-sectional area that is required to attain a required level of stress tolerance improvement. The higher the elastic modulus of the strip, the less of it is required for the reinforced tape to support the same tensile stress tensile stress.

Embodiments described herein identify the convergence of architecture, material attributes and process conditions for attaining greatly superior stress tolerance over the current state of the art, and the application of practical reinforcement materials that meet these requirements sufficiently to produce a reinforced superconductor with demonstrated stress tolerances exceeding the best mechanical properties attained in the state of the art.

A selection of materials for this type of reinforcement include alloys; non-limiting examples of alloys that can be used with other aspects herein described include hard temper stainless steel, and more preferably, Co—Cr—Ni alloys with modulus of elasticity exceeding 205 Giga Pascals (GPa), coefficient of thermal expansion (CTE) exceeding 12 ppm m/m/K, and proportional limit strain exceeding 0.40%. The shapes preferred for the strips in particular embodiments are preferably produced by forming the flat rolled and slit strips into the U shaped channels and slit cylinders before the final aging step.

Figure 3:
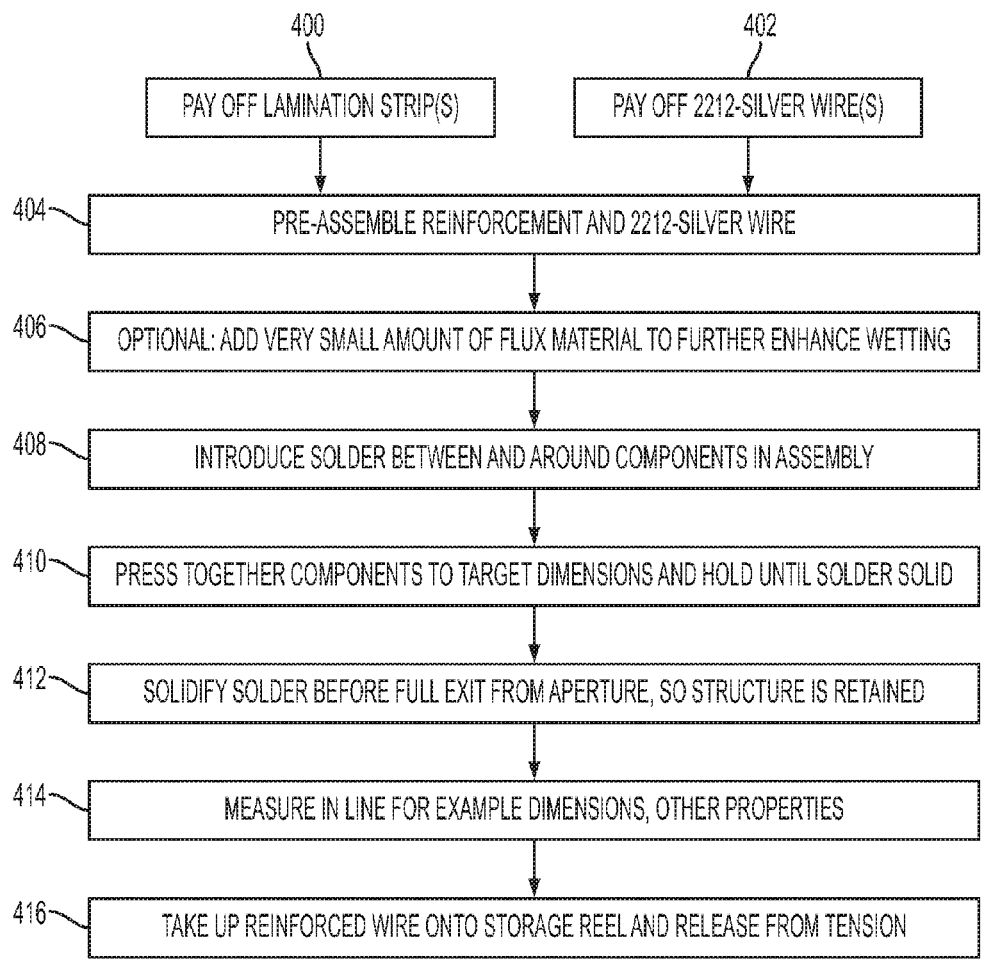
FIG. 3 illustrates a method of reinforced round wire production.

Description of Specific Embodiments of Reinforcement Processes as Shown in FIG. 3

FIG. 3 depicts a method of reinforced wire production. More specifically FIG. 3 is an illustration of the method of reinforced round wire production, wherein in specific embodiments the reinforcement strip, in addition to the method aspects shown, may have been subjected to wetting enhancement treatments, in specific embodiments including addition of materials to the surface that are well wetted by the selected solder alloy. Specific aspects shown include: pay off lamination strips 400, involving application of tension Fs to strain the strip past halfway to the proportional strain limit, using dancing arm controls, using in specific embodiments a traversing level wind pay off for shaped strips and using reel pay offs for flat strips; pay off 2212 Ag wire(s) 402, referring to applying tension Fw as low as possible, and just enough to keep a silver wire core properly fed, the pay off can be a single layer level wind or a traversing spool and can use dancing arm controls; pre-assemble reinforcements and HTS wire 404, referring to using precision guides such as grooved rolls for channel and split cylinder embodiments, and in specific embodiments using slotted aperture tools for strips; optional 406, referring to adding a very small amount of flux material to further enhance wetting; introduce solder between and around components in assembly 408, referring to immersing into molten solder bath in controlled atmosphere, requiring good control over temperatures composition, tool condition; press together components to target dimensions and hold until solder solid 410, referring to passing assembly into aperture die or similar tool with a target final wire geometry, the entry end of the tooling aperture may be immersed in solder, and the exit end is not immersed in solder; solidify solder before full exit from aperture, so is retained 412, referring to chilling the assembly by using a gas, liquid or sliding conduction cooled quench towards the exit side of the aperture, and in specific embodiments a two part aperture tool, with a hot side and a chilled side, and in embodiments using a quench the liquid quench medium may be water, a water solution, a molten metal, or oil; measure in line for example dimensions, other properties 414, refers to use of a laser micrometer and/or gauges such as a Vollmer tool to test dimensions, and using an optical system to detect and map local apparent flaws; and take up reinforced wire onto a storage reel 416, referring to use of a take up reel, spool, or level wind configuration with a controlled rate.

Still regarding FIG. 3, depicting a method of reinforced wire production; one, some, or all of the aspects of the method, when applicable, can be used to produce one or more aspects of specific embodiments of other wires described herein. An example series of acts are: that wire and strip are fed from their respective payoffs, also known as a feeder system (400, 402), and the shaped strips are preformed into channel or split cylinder configurations 404, and their surfaces may contain wetting enhancement materials like copper or tin that may be plated 406, vapor deposited, sputtered, or applied by for example hot dipping. A relatively large back tension (Fs) is applied to the strips, straining them beyond about 30% of the way to their proportional limit strain. However a much smaller tension (Fw) is applied to the 2212/Ag wire, just enough needed to maintain its path through the line. This way, upon attachment and unloading, the strip will contract and place the 2212/Ag wire into axial compression, allowing for more tensile strain, and stress before the tensile strain limit of the 2212 material in the composite is reached.

The components are fed into the assembly tool that places the components generally into the required positions. For example, the round wire is fed into the split cylinder channel of the strip by separating the slot with a small tool, and converging the wire towards the strip and pushing it into the slot with for example grooved rolls. The grooved roll for the wire has a roll diameter that is at least 400 times the diameter of the wire, in order to avoid damaging the 2212 inside the wire.

The assembled components are then subjected to a flux application step, if warranted by the wetting requirement.

After flux application, the assembly passes into molten solder, which penetrates between and wets all the components.

The assembly then passes into the aperture of the attachment tool, which completes full convergence of the assembly components to the final, target dimensions and shape; This entry may be completed with the assembly still immersed in solder, or after exiting it, but always in sufficiently hot state to allow the components to converge.

As the assembly then passes towards to exit side of the aperture, it is rapidly chilled, and solidified sufficiently to maintain the intended dimensions imparted by the exit side of the aperture. The solidification temperature of the solder is a critical parameter for improved mechanical properties. Higher temperature locks in the axially pre-strained strip structure, while allowing for a greater level of total thermal contraction in the reinforced wire, above the contraction that would occur if there were no reinforcement used. In specific embodiments chilling is a cooling through the temperature range from the onset of solder solidification (at its liquidus temperature) to its completion (at its solidus temperature) in less than about 1 second or more preferably in less than 100 milliseconds, or a reduction of temperature from the onset of solder solidification to its completion at a rate in excess of 100 degrees Celsius per second.

Figure 4:
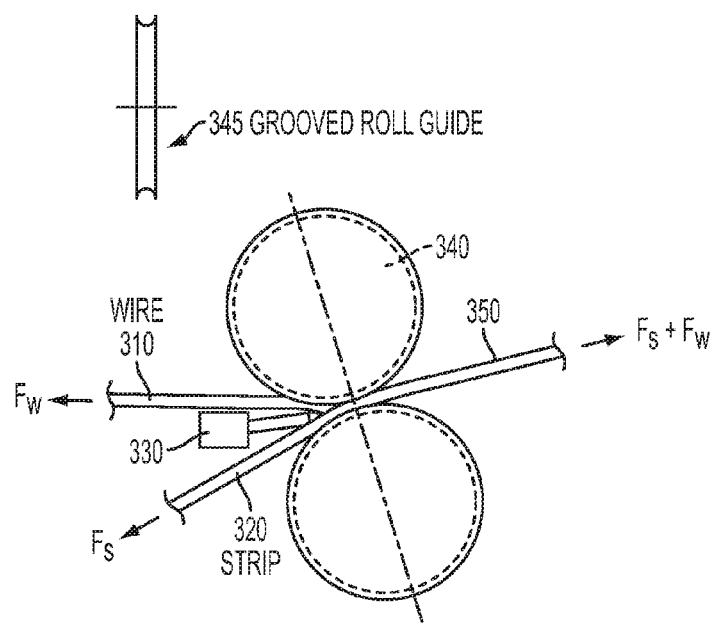
FIG. 4 illustrates a round wire assembly process.

Description of Specific Embodiments of Round Wire Assembly as Depicted in FIG. 4

The reinforcement strip 320 in its preformed split cylinder condition is paid off towards the assembly tooling, as is the round 2212/Ag wire 310. The tension in the strip is much greater than the tension in the wire. At the assembly tool approach, a small strip separating tool 330 is inserted into and rides the inner edges of the split cylinder, thereby opening it to a size sufficiently in excess of the size of the wire to allow the wire to be rotated into the trough cavity inside the strip.

In one embodiment, the strip and wire are converged as shown by grooved rolls 345, of sufficiently large diameter to avoid damaging the silver wire core or strip. The silver wire core and the split cylinder shaped layers of high strength reinforcing metal are pushed toward the soldering apparatus 340 on the grooved rolls 345, and a view of the grooved roll guide is provided at the top of FIG. 4. In the case of the wire, that diameter of the roller would be in excess of about 275 times the wire diameter. The assembly produces a loose combination of strip and wire 350, with the strip rebounding back around the wire somewhat and enough to contain it in its channel after release from the strip edge separating tool. The grooved rolls are fabricated with groove diameters between 1 to 2 times the wire diameter. They may be passively rotating or driven.

From here, additional strips may be added by the assembly by the method described, before completing processing as described in FIG. 3. In one embodiment, the assembly is passed after loose assembly at a downward sloping angle into a solder bath, and through a hot compression tool, which when exited is immediately followed by a rapid solidification quench.

Specific embodiments described herein and used with any other aspect of the invention described herein include: silver composite wire, and in a specific example 2212/Ag composite wire, of substantially round cross section, surrounded substantially by one or more thin split cylinder shaped layers of high strength reinforcing metal and bonding material between the composite wire and reinforcement materials such that the area fraction of all added materials to provide and attach reinforcement plus reinforcement occupy less than about 50% of the total reinforced article cross section and the tensile stress tolerance of the reinforced wire exceeds about 400 MPa, and its tensile strain tolerance exceeds about 0.30% below a temperature of about 300 K; articles can have additional layers of thin wetting enhancing material and/or materials between the surfaces of the reinforcement material and the bonding material; articles can be configured for reinforcement materials to surround between about 90% and about 100% of the silver composite wire anywhere along the length of a reinforced wire; articles can exhibit a tensile stress tolerance of greater than about 500 MPa, tensile strain tolerance greater than about 0.30% and bend tolerance to diameters that are no more than about 250 times the core wire diameter; articles can be comprised of two cylinder shaped reinforcement strips with an inner layer covering between about 50% and about 100% of the 2212/Ag core wire and an outer layer covering between about 0 and about 100 percent of the inner layer and at least about 90% of the 2212/Ag; articles can be comprised of two or more cylinder shaped reinforcement strips, in which each strip covers about 90% to about 100% of the underlying layer and the gap between the two convergent edges of each layer are at least about 90 degrees rotated on the cross section from the gap in the immediately underlying reinforcement layer; articles with a silver wire core which can be a 2212/Ag wire core or a 2223/Ag core can exhibit a diameter in the range of about 0.2 mm to about 2 mm anywhere along a reinforced wire length; a reinforced wire article can have an outer diameter in the range of about 0.25 mm to about 3 mm diameter; a reinforcement article can have a portion and or component with an FOM of about >750; a reinforcement article can have a portion and or component with CTE>11 ppm m/m/K, Modulus of about >205 GPa and proportional limit of about >0.45%; stainless steel can be used with or as part or portions of embodiments described herein; MP35N, MP159 and like Co—Cr—Ni alloys can be used in or with embodiments described herein; coils and cables can be made from reinforced wire such as reinforced 2212/Ag wire exhibiting the properties and structure described herein.

The invention is also considered to include the application of reinforcement as described to bundles of round or other low aspect cross sectioned shaped HTS wire. In this case, the bundles may be twisted about their axis, in order to improve uniformity and reduce energy loss when the conductor is subjected to time varying magnetic fields. In particular, the individual elements inside the bundle may also be comprised of reinforced low aspect wire as described herein. This form is particularly useful in that the application of the reinforcement related materials not only facilitates much better cabling without damaging wires, but they also provide for improved wire to wire partial electrical decoupling, as consequently much lower induced current loop coupling losses, by way of the higher electrical resistance of the reinforcement materials. The axial twist pitches contemplated range from about 2 mm to about 1000 mm in length, and the coupling losses are reduced by up to 80% as compared to cable bare wire. Specific embodiments provide for reinforced high temperature superconducting silver wire and/or wires. Specific embodiments provide for reinforced high temperature superconducting 2212 ($Bi_2Sr_2Ca_1Cu_2O_x$) silver wire and/or 2223 ($Bi_2Sr_2Ca_2Cu_3O_x$) wires.

The following are incorporated by reference as outlined in 1.57(b)(1): U.S. Pat. No. 5,059,582, U.S. Pat. No. 5,801,124, U.S. Pat. No. 5,987,342, U.S. Pat. No. 6,230,033, U.S. Pat. No. 6,711,421, A. Otto, E. J. Harley and R. Mason, *Supercond. Sci. Technol.* 18 (2005) S308-S312), A. Otto, E. Podtburg, R. Mason and P. Antaya, IEEE Transactions on Applied Superconductivity, Vol 17 pp. 3071-3074.

EXAMPLES

Embodiment provided herein will be better understood by reference to the following examples which are offered by way of illustration not limitation.

Example 1

A fully processed 0.8 mm diameter wire 2212/Ag wire containing about 25 volume percent 2212, and exhibiting a critical current in excess of 300 A at 4.2 K and 5 T, is processed as described. The tension in the wire is less than 3 N. A split cylinder shaped reinforcement strip comprised of 304 (and in some cases 316) stainless steel with a hard temper that is 0.05 mm thick and that was formed from a flat strip about 2.5 mm in width to a split cylinder shape of about 1 mm diameter is fed into the assembly tool with a tension of 65 N applied. The stainless steel strip has been pretreated to improve wetting by chemical cleaning followed by electroplating of tin to an average thickness of about 2 micrometers.

The working and groove diameters of the wire grooved roll are about 25 cm and 0.11 cm respectively, and the working and groove diameters of the strip grooved roll are about 10 cm and 0.13 cm.

The separating tool is a flat shape about 0.5 mm thick with rounded edges, in the plane occupied by the wire, strip and rolls. It is about 1.0 mm across (wide) and is inserted into the strip slot about 1 cm away from the start of entry of the wire into the strip trough, separating the slot enough to allow the wire to be fed in by the rolls as they converge. Once past the splitting tool the slot starts to rebound together but by then the wire is being pushed in by the roll, keeping it open, and the wire enters the trough. Upon exiting the roll the wire is inside the cavity of the strip, and the split between its edges is about 0.4 mm wide. The assembly is then passed through the assembly tool a second time and a second strip is placed around the wire and inner first strip.

In one approach the assembly is passed through a heated chamber where an organic flux is applied to the system as a spray.

The assembly is then passed over a grooved roll to angle it down into a molten solder bath at with a high tin solder composition. In the bath the assembly enters the attachment and hot compression tool, which has a cylindrical aperture of about 1.03 mm in diameter. There the strip is conformed onto the wire such that there is about 0.010 mm thickness of solder between the strips and the inner strip and wire, and about 0.005 mm solder thickness on the outer surface.

The assembly tool also serves as the exit port for the assembly from the solder. The compressed assembly is then passed through the cavity of the attachment tool to the chilled section, where contact with a forced chilled oil cooling tool is applied to the surface to cool and solidify the solder before the assembly structure can rebound to a larger diameter. Water can also be employed here to solidify the solder, depending on the travel rate through the attachment tool.

The resulting wire contains two layers of 0.05 mm thick stainless, with a gap of about 0.05 mm and 0.2 mm at the converging edges of each strip.

The strips are positioned so as to maintain the gaps at about 180 degrees relative to each other, and the compression upon rebound and friction keeps them in this position.

The resulting reinforced wire contains about 40 percent by area added reinforcement material. Upon testing the tensile stress tolerance is found to be 440 MPa, the tensile strain tolerance if found to be 0.37% and the bend tolerance is found to be 14 cm. The surface can support a local compressive load (over a nominally less than 0.003 mm² area) to a stress level in excess of about 200 MPa before damage occurs to the 2212 material, as compared to a maximum load of about 100 MPa for 2212/Ag wire.

Example 2

The round wire of Example 1 is reinforced as describe, but with aged alloy MP35N® (modulus of 220 GPa, proportional limit of 0.8% and CTE of 13 ppm m/m/K), and a tension of 160 N per strip. The reinforced wire made exhibits the same geometry as the wire in Example 1, but with a tensile stress tolerance of 600 MPa, tensile strain tolerance of 0.37% and bend tolerance of about 14 cm. In this case the indent tolerance is in excess of 400 MPa of applied surface load.

Example 3

The round wire of Example 1 is reinforced with a single layer of MP35N® as described in Example 2 for the double layer. The sample is about 0.92 mm in diameter, and exhibits a tensile stress tolerance of 520 MPa, a tensile strain tolerance of 0.35% cm and bend tolerance of 15 cm. The areas fraction of reinforcement is 25%. In specific embodiments the area fraction of reinforcement is about 25%.

Example 4

Summary of stress and strain tolerance improvements by reinforcement of 2212/Ag wire in the manner described.

Wires Reinforced

Samples of fully processed round 2212/Ag wires comprised of a silver alloy matrix and multiple filaments of the Bi2212 superconductor were received from Oxford Instruments. The wires were approximately 20 to 30% 2212 by volume and different batches had diameters ranging approximately from 0.08 cm to 1.4 cm.

Preparation of Reinforced Wire

Wire 2212/Ag Wire Cleaning

Each wire's surface was cleaned with a combination of surface wiping with a solvent and an acidic metal surface cleaner, for example known by the brand name Citronox® supplied by the Alconox Corporation.

Reinforcement Flat Tape Manufacture

Strips comprised of the alloy MP35N® and 316 as well as 304 stainless steel were custom manufactured in the following manner: wide hard strength sheet was rolled by the sheet metal vendor to thicknesses of 0.02 mm to 0.05 mm, the sheets were cleaned and slit to the final desired width, in this case, 0.3 cm to 0.8 cm wide, the slit strips were cleaned and plated with a metal that is well wetted by solder, in this case copper and tin were applied to different lots to a thickness of about 2 micrometers, the strips were coiled up onto storage reels (i.e. take-up reel) and stored in hermetic packages.

Split cylinder shaped reinforcement strips were produced by pulling section of the reinforcement strips through shaping dies comprised of a gradual taper into a round forming-hole of the appropriate diameter to attain a split cylinder shape into which the wire could be readily inserted. The forming-hole diameters in this case that worked adequately were in the range of 1.0 to 1.5 times the wire diameters onto which the split cylinder strips were going to be laminated.

The rebound of the cylindrical shapes varied with the type of reinforcement strip, its thickness and forming-hole diameter. The thicker the strip relative to the hole diameter the smaller the rebound, however if the strip was too thick for the hole, it exhibited longitudinal surface cracking on its outside and kinking. In this case the situation was improved by using a cylindrical tool with diameter given by: tool diameter~forming-hole diameter−2 times the strip thickness. This tool was positioned on the axis of the forming-hole opening with its end about 1 to 2 mm away from the feed-in side. This tool acted as an inside former for the strip and helped keep it from kinking as it was sharply bent to form the split cylinder shape.

Insertion of the Wires into the Split Cylinder Reinforcement

Cleaned wire samples were very thinly coated with an organic liquid flux, and inserted into a section of the split cylinder strip that was fed off a reel under applied tension using trailers and leaders. The jacketed assembly was passed through a round aperture (about 1.5× wire diameter) in a downward tilting stainless steel trough that was placed inside a heated chamber, such that the entry point into the trough was also coincident with an opening in the wall of the heated chamber wall. The angled (~20 to 30 degrees) trough contained molten solder, in this case a very widely used, high tin-silver-copper solder known as SAC 305. The atmosphere inside the chamber was maintained at very low oxygen content (<100 ppm) to avoid buildup of oxide on the molten solder surface. The assembly descended in a straight line at a 20-30 degree angle tilt from the horizontal. It intersected the horizontal surface of the solder about ⅓ of the way along the trough length and there it immersed into the solder. The solder flowed between the wire and split cylinder region and wetted all the surfaces of the 2212/Ag wire and surface treated reinforcement, assisted by the flux.

The assembly continued in a straight downward sloping line through the molten solder and out of the solder and trough through the aperture of a hot forming assembly and compression tool with a diameter closely matched to the combined final diameter of the 2212/Ag wire plus added reinforcement material. With relatively small solder depth to minimize liquid solder pressure and tight tolerance, very little excess solder leaked past the assembly. Immediately after passing through this hot forming tool, the wire exited the heated chamber through an opening in the thin metal chamber wall. As the assembly moved at a steady rate, a flowing water stream was applied to it, for example no more than 2 cm away from the exit side opening of the hot forming tool. This water stream rapidly solidified the solder between the reinforcement and 2212/Ag wire, forming a well bonded reinforced wire. Upon release of the wire from the equipment, the tension in the split cylinder reinforcement caused contraction in wire length, until the internal axial compression in the 2212/Ag matched the remaining internal axial tension in the reinforcement.

In this manner, the 2212/Ag can be placed into a desired amount of axial compression that can increase its axial tensile stress and strain tolerance.

Samples of these wires were tested for axial tensile force, stress and critical current retention versus elongation strain. The critical stress and strain correspond to the levels where current carrying capacity, denoted as critical current, starts to decrease due to damage to the superconducting 2212 oxide in the silver matrix.

Data presented in Table 1, below, illustrates the benefits realized from application of reinforcement by the method described. The Table shows data for samples produced at different conditions and architectures with reinforcement of round 212/Ag wires, showing up to 2.8 fold improvement in critical tensile stress tolerance, as well as improved strain and bend tolerance compared to non reinforced wire (Note "Reinf" refers to reinforced).

TABLE 1

| 2212/Ag Diameter (cm) | Reinf Material | Reinf Thickness (cm) | Reinf Width (cm) | # Reinf Strips | # Reinf Layers | Lam Reinf Total Tension (N) | Final Diameter (cm) | Critical Stress (MPa) | Critical Strain (%) | Critical Bend Dia. (cm) |
|---|---|---|---|---|---|---|---|---|---|---|
| 0.08 | NA | NA | NA | 0 | 0 | 0 | 0.08 | 144 | 0.26 | 26 |
| 0.08 | SS 316 | 0.002 | 0.25 | 1 | 1 | 0 | 0.086 | 220 | 0.31 | 22 |
| 0.08 | SS 316 | 0.002 | 0.25 | 1 | 1 | 30 | 0.086 | 271 | 0.39 | 18 |
| 0.08 | SS 316 | 0.002 | 0.50 | 1 | 2 | 0 | 0.093 | 265 | 0.34 | 21 |
| 0.08 | SS 316 | 0.002 | 0.5 | 1 | 2 | 60 | 0.093 | 351 | 0.44 | 17 |
| 0.08 | SS316 | 0.002 | 0.25 | 3 | 3 | 90 | 0.101 | 419 | 0.49 | 17 |

TABLE 1-continued

| 2212/Ag Diameter (cm) | Reinf Material | Reinf Thickness (cm) | Reinf Width (cm) | # Reinf Strips | # Reinf Layers | Lam Reinf Total Tension (N) | Final Diameter (cm) | Critical Stress (MPa) | Critical Strain (%) | Critical Bend Dia. (cm) |
|---|---|---|---|---|---|---|---|---|---|---|
| 0.14 | SS316 | 0.005 | 0.44 | 2 | 2 | 270 | 0.191 | 438 | 0.48 | 22 |
| 0.14 | MP35N ® | 0.037 | 0.45 | 2 | 2 | 380 | 0.184 | 445 | 0.43 | 23 |

Specific embodiments of devices or methods as described herein may use one or more of: the reinforcing metal comprising an alloy comprising copper, chromium, and nickel with a modulus of elasticity exceeding 205 Giga Pascals (GPa) and a proportional limit strain exceeding 0.40 percent; the reinforcing metal comprises stainless steel; the bonding material is a solder containing at least 5 percent of tin, lead, antimony, gallium, indium, and cadmium; a layer of wetting enhancing material between the reinforcing metal and the bonding material, the wetting enhancing material comprising copper, silver, or gold; a layer of wetting enhancing material between the reinforcing metal and the bonding material, the wetting enhancing material comprising tin, lead, and indium; the reinforcing metal surrounding between about 90 percent and about 100 percent of the exterior surface of the silver wire core at the point along the length of the composite wire; the composite wire exhibiting a tensile stress tolerance of greater than 400 Mega Pascals and a bend tolerance to diameters that are no more than 250 times the core wire diameter; one or more split cylinder shaped layers of high strength reinforcing metal comprising two split cylinder shaped layers, the layers comprising an inner layer covering between about 50 percent and about 100 percent of the silver wire core and an outer layer covering between about 0 percent and about 100 percent of the inner layer and at least 90 percent of the core wire at the point along the length of the composite wire; the two split cylinder shaped layers are formed from a single continuous strip of the reinforcing metal; wherein one or more split cylinder shaped layers of high strength reinforcing metal comprises two or more cylinder shaped reinforcement metal strips overlayed, each of the metal strips having a gap, in which each strip covers about 90 percent to about 100 percent of each respective underlying layer and the gap of each layer is approximately 90 degrees rotated in a circumferential direction from the gap in the immediately underlying reinforcement layer; the silver wire core having a diameter in the range of about 0.2 mm to about 2 mm at a point along the composite wire length; the composite wire having an outer diameter in the range of about 0.25 millimeters to about 3 millimeters; applying flux to the silver wire core and the reinforcing metal prior to the solder application, and wherein the applying of the back tension is at a level of approximately one thirds to two thirds the proportional strain limit for the reinforcing metal; bundling the reinforced high temperature superconducting silver with at least a second and a third composite wire to form a cable; coiling up the reinforced high temperature superconducting silver composite wire onto storage reels and storing the reinforced wire in hermetic packages; the diameter of each of the grooved rolls being at least 400 times the diameter of the wire; contacting the silver wire core and the reinforcing metal with a forced chilled oil or water cooling tool to provide the chilling. In specific embodiments devices or methods provided herein can comprise wherein the split cylinder shaped reinforcing metal comprises a deformed or heat treated split cylinder shaped reinforcing metal, and/or wherein the substantially U-shaped reinforcing metal comprises a deformed or heat treated U-shaped reinforcing metal. Methods provided herein can include wherein the reinforcing metal is deformed or heat treated to increase its yield stress and strain after the split cylinder shape is formed, and/or wherein the reinforcing metal is deformed or heat treated to increase its yield stress and strain after a U-shape is formed. The method can comprise heat treating or deforming any reinforcing metal provided herein after the reinforcing metal is shaped and/or prior to joining with the silver wire core. In specific embodiments the deforming can be, for example, stretching of the reinforcement material.

The invention claimed is:

1. A reinforced high temperature superconducting composite wire comprising:
   a silver/superconducting oxide composite wire core of substantially round cross section having a length and an exterior surface;
   one or more split cylinder shaped layers of high strength reinforcing metal circumferentially surrounding a substantial portion of the exterior surface of the silver wire core at a point along the length of the composite wire; and
   a bonding material between the silver wire core and the reinforcing metal; and
   the reinforcing metal and the bonding material at the point along the length of the composite wire occupy less than about 50 percent of the total composite wire cross sectional area and the tensile stress tolerance of the composite wire exceeds about 300 Megapascal, and tensile strain tolerance exceeds 0.30 percent when the composite wire is below a temperature of about 300 Kelvin.

2. The composite wire of claim 1 wherein the reinforcing metal comprises an alloy comprising copper, chromium, and nickel with a modulus of elasticity exceeding 205 gigapascals (GPa) and a proportional limit strain exceeding 0.40 percent, where the metal is deformed or heat treated to increase its yield stress and strain after the split cylinder shape is formed.

3. The composite wire of claim 1 wherein the reinforcing metal comprises stainless steel.

4. The composite wire of claim 1 wherein the bonding material is a solder containing at least 5 percent of tin, lead, antimony, gallium, indium, or cadmium.

5. The composite wire of claim 1 further comprising a layer of wetting enhancing material between the reinforcing metal and the bonding material, the wetting enhancing material comprising copper, silver or gold.

6. The composite wire of claim 1 further comprising a layer of wetting enhancing material between the reinforcing metal and the bonding material, the wetting enhancing material comprising tin, lead, or indium.

7. The composite wire of claim 1 wherein the reinforcing metal surrounds between about 90 percent and about 100 percent of the exterior surface of the silver wire core at the point along the length of the composite wire.

8. The composite wire of claim 1 wherein the composite wire exhibits a tensile stress tolerance of greater than 400

Megapascals and a bend tolerance to diameters that are no more than 250 times the core wire diameter.

9. The composite wire of claim 1 wherein the one or more split cylinder shaped layers of high strength reinforcing metal comprises two split cylinder shaped layers, the layers comprising an inner layer covering between about 50 percent and about 100 percent of the silver wire core and an outer layer covering between about 0 percent and about 100 percent of the inner layer and at least 90 percent of the core wire at the point along the length of the composite wire.

10. The composite wire of claim 8 wherein the two split cylinder shaped layers are formed from a single continuous strip of the reinforcing metal.

11. The composite wire of claim 1 wherein the one or more split cylinder shaped layers of high strength reinforcing metal comprises two or more cylinder shaped reinforcement metal strips overlayed, each of the metal strips having a gap, in which each strip covers about 90 percent to about 100 percent of each respective underlying layer and the gap of each layer is at least 90 degrees rotated in a circumferential direction from the gap in the immediately underlying reinforcement layer.

12. The composite wire of claim 1 wherein the silver wire core has a diameter in the range of about 0.2 mm to about 2 mm.

13. The composite wire of claim 1 comprising an outer diameter in the range of about 0.25 millimeters to about 3 millimeters.

14. A reinforced high temperature superconducting silver composite wire comprising:
  a silver wire core of substantially rectangular cross section of width less than three times its thickness, having a length and an exterior surface;
  two or more strips of high strength reinforcing metal that are each substantially U-shaped, together surrounding the entire exterior surface of the silver wire core along the length of the composite wire, the two or more strips arranged on directly opposing sides of the silver wire core, overlapping each other for substantially the entire length of two sides of the silver wire core; and
  a bonding material between the silver wire core and the reinforcing metal; and
  the reinforcing metal and the bonding material at the point along the length of the composite wire occupy less than about 50 percent of the total composite wire cross sectional area and the tensile stress tolerance of the composite wire exceeds about 300 Megapascal, and tensile strain tolerance exceeds 0.30 percent when the composite wire is below a temperature of about 300 Kelvin.

15. A method of producing reinforced high temperature superconducting silver composite wire comprising:
  providing:
    a silver wire core of substantially round cross section having a length and an exterior surface;
    a split cylinder shaped layer of high strength reinforcing metal; and
  feeding the silver wire core and the reinforcing metal from their respective payoffs towards each other while applying back tension to the silver wire core and the reinforcing metal, such that the back tension applied to the silver wire core is less than the back tension applied to the reinforcing wire;
  feeding the silver wire core and the reinforcing metal into an assembly tool;
  pushing the silver wire core into the reinforcing metal with grooved rolls;
  applying flux, solder, heat, and providing a converging force with a hot compression tool to the silver wire core and the reinforcing metal; and
  chilling the silver wire core and the reinforcing metal;
  producing the reinforced high temperature superconducting silver composite wire wherein the reinforcing metal and the bonding material at a point along the length of the composite wire occupy less than about 50 percent of the total composite wire cross sectional area and the tensile stress tolerance of the composite wire exceeds about 300 Megapascal, and tensile strain tolerance exceeds 0.30 percent when the composite wire is below a temperature of about 300 Kelvin.

16. The method of claim 15 further comprising applying flux to the silver wire core and the reinforcing metal prior to the solder application, and wherein the applying of the back tension is at a level of approximately half the proportional strain limit for the reinforcing metal.

17. The method of claim 15 further comprising bundling the reinforced high temperature superconducting silver with at least a second and a third composite wire to form a cable.

18. The method of claim 15 further comprising coiling up the reinforced high temperature superconducting silver composite wire onto storage reels and storing the reinforced wire in hermetic packages.

19. The method of claim 15 wherein the diameter of each of the grooved rolls is at least 400 times the diameter of the wire.

20. The method of claim 15 further comprising contacting the silver wire core and the reinforcing metal with a forced chilled oil, water or air cooling tool to provide the chilling.

21. The composite wire of claim 1 wherein the split cylinder shaped reinforcing metal comprises a deformed or heat treated split cylinder shaped reinforcing metal.

22. The composite wire of claim 14 wherein the substantially U-shaped reinforcing metal comprises a deformed or heat treated U-shaped reinforcing metal.

* * * * *